United States Patent [19]

Tanimura et al.

[11] Patent Number: 4,554,729
[45] Date of Patent: Nov. 26, 1985

[54] METHOD OF MAKING SEMICONDUCTOR MEMORY DEVICE

[75] Inventors: Nobuyoshi Tanimura, Musashino; Tokumasa Yasui, Kodaira, both of Japan

[73] Assignee: Hitachi, Ltd., Tokyo, Japan

[21] Appl. No.: 341,623

[22] Filed: Jan. 22, 1982

[30] Foreign Application Priority Data

Feb. 6, 1981 [JP] Japan .................. 56-15733

[51] Int. Cl.$^4$ .................. H01L 21/28; H01L 21/26
[52] U.S. Cl. .................. 29/577 C; 29/576 B; 29/571; 148/1.5; 148/187; 148/DIG. 82; 357/23.6; 357/91
[58] Field of Search .................. 29/571, 576 B, 577 C; 148/1.5, 187; 357/23, 91

[56] References Cited

U.S. PATENT DOCUMENTS

| | | | |
|---|---|---|---|
| 4,167,804 | 9/1979 | Greensten | 29/577 C |
| 4,240,097 | 12/1980 | Raymond, Jr. | 357/59 |
| 4,246,593 | 1/1981 | Bartlett | 357/41 |
| 4,317,274 | 3/1982 | Yasunari | 29/571 |
| 4,370,798 | 2/1983 | Lien et al. | 29/576 B |
| 4,397,077 | 8/1983 | Derbenwick et al. | 29/571 |
| 4,408,385 | 10/1983 | Rao et al. | 29/576 B |
| 4,475,964 | 10/1984 | Arizumi et al. | 148/187 |

*Primary Examiner*—Upendra Roy
*Attorney, Agent, or Firm*—Antonelli, Terry & Wands

[57] ABSTRACT

Herein disclosed is a semiconductor memory device which is composed of a peripheral circuit unit equipped with a gate protection circuit having a protection resistor and a memory cell unit so that it can be used as an MISFET type static RAM and which is characterized in that the protection resistor is made of a polycrystalline silicon film having substantially the same resistivity as that of an overlying polycrystalline silicon film formed to merge into the load resistor of the memory cell unit.

23 Claims, 32 Drawing Figures

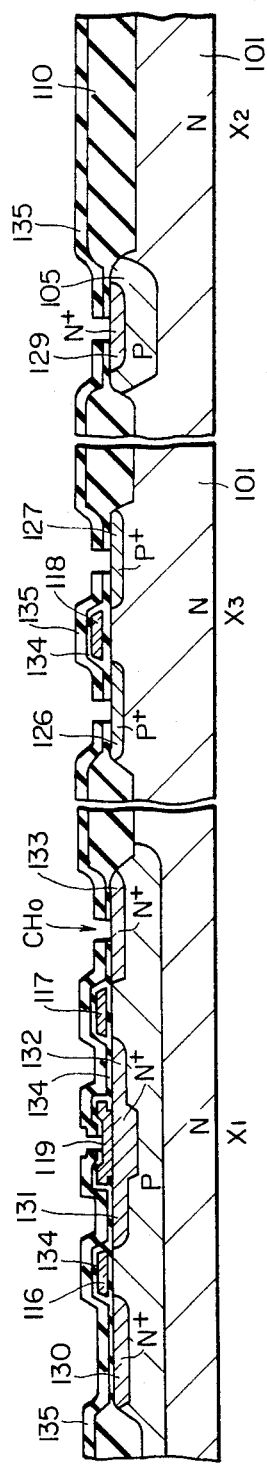

METHOD OF MAKING SEMICONDUCTOR MEMORY DEVICE

BACKGROUND OF THE INVENTION

The present invention relates to a semiconductor memory device, and, more particularly, to a static RAM (i.e, Random Access Memory), which is composed of MIS (i.e., Metal Insulator Semiconductor) type field effect transistors (which will be shortly referred to as "MISFETs") and a fabrication process thereof.

In an MIS type semiconductor integrated circuit device (which will be shortly referred to as an "IC"), and input protection circuit composed of a resistor and a diode may be connected between an input terminal and a gate so as to protect the gate of an MISFET which is to be fed with a signal coming from the outside of the IC. It is conceivable to use a diffusion resistor, which is prepared in a semiconductor wafer by the diffusion technique, as that input protection resistor. According to our investigations, however, it has been found that, in case a C-MOS is used in the peripheral circuit unit other than the memory cells of the aforementioned static RAM, such diffusion resistor never fails to be formed with a PN junction so that the ratch-up phenomenon takes place. In order to prevent this phenomenon, we have conceived to use a polycrystalline silicon film (which will be shortly referred to as a "poly Si film"), which is formed over the field oxide film of the semiconductor wafer, as the input protection resistor. As a forming method of this input protection resistor, we have also conceived to use the poly-Si film which is formed simultaneously with the poly-Si gate electrodes of the MISFETs of the peripheral circuit unit, the poly-Si gate electrodes of the MISFETs in the memory cells and the poly-Si word lines in the memory cells. In this case, however, in order to shorten the propagation delay time of the signals at the gates and the word lines, the aforementioned poly-Si film has to be doped with phosphorous to have its specific resistance lowered (to 30 $\Omega/\square$, for example). In order to have the desired resistivity (about 2 K$\Omega$) required of the input protection resistor, therefore, it is necessary to enlarge the wiring length of the poly-Si film. As a result, it has also been found that the area occupied by the protection resistor is enlarged to augment the chip size, which is disadvantageous for the improvement of integration.

SUMMARY OF THE INVENTION

It is, therefore, an object of the present invention to provide a static RAM of such a high integration that the area occupied by an input protection resistor is reduced.

Another object of the present invention is to provide a fabrication process which can fabricate the aforementioned static RAM without any difficulty.

A further object of the present invention is to provide a fabrication process which can fabricate the aforementioned static RAM without any change in the existing fabrication process.

DESCRIPTION OF THE PREFERRED EMBODIMENT

Figure 1:
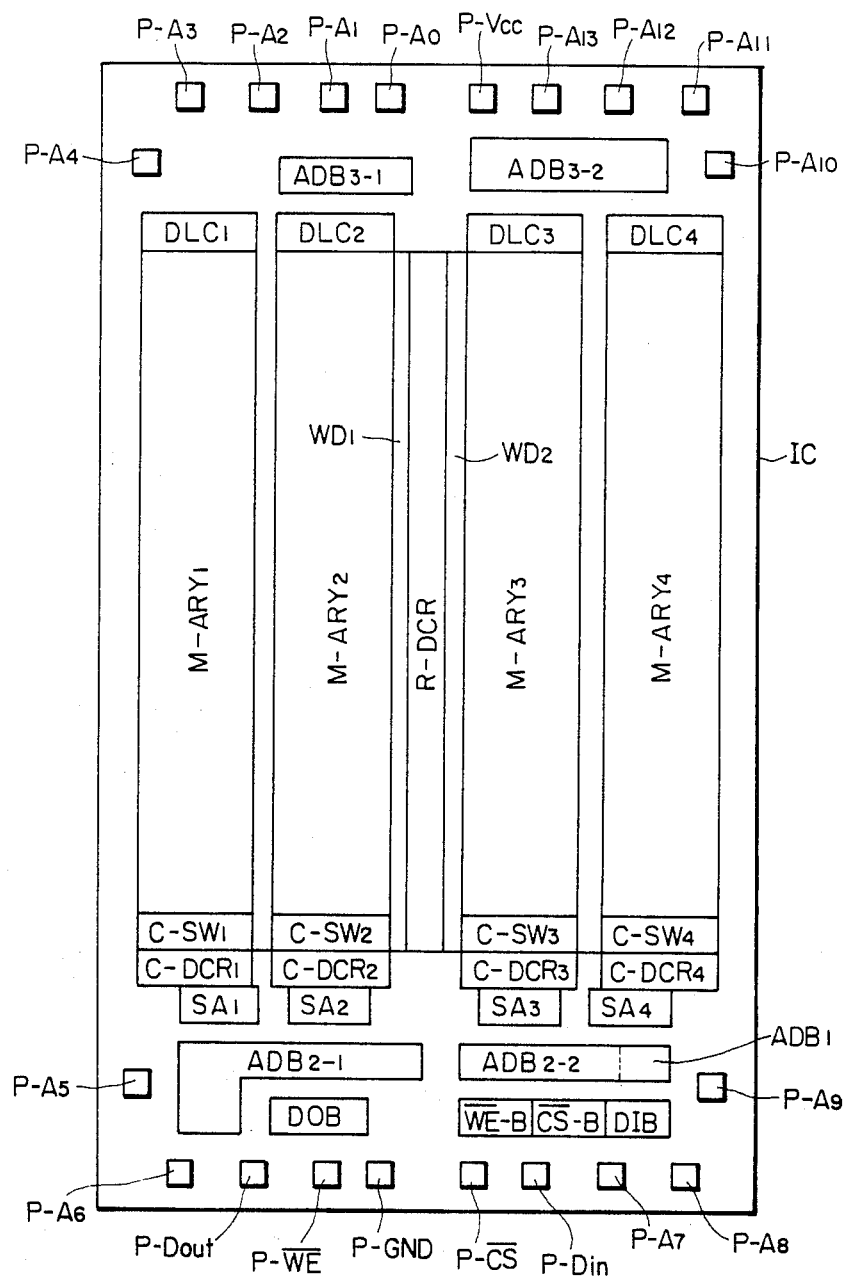
FIG. 1 is a schematic layout showing a static RAMIC according to the present invention.

First of all, the top plan layout pattern of a static RAMIC according to the embodiment of the present invention will be described with reference to FIG. 1.

This RAMIC is made to have the so-called "four mat type layout pattern", in which four memory arrays are divided in a single IC chip such that there are separately arranged in the IC chip four memory arrays M-ARY$_1$, M-ARY$_2$, M-ARY$_3$ and M-ARY$_4$, which are composed of a plurality of memory cells (M-CELs). The memory arrays M-ARY$_1$ and M-ARY$_2$ are arranged at one side of the IC chip whereas the memory arrays M-ARY$_3$ and M-ARY$_4$ are arranged at the other side, and A row decoder R-DCR for the memory arrays M-ARY$_1$ to M-ARY$_4$ is arranged at the center portion of the IC chip, which is sandwiched between those two portions. Between the memory array M-ARY$_2$ and the row decoder R-DCR and between the memory array M-ARY$_3$ and the row decoder R-DCR, moreover, there are arranged word drivers WD$_1$ and WD$_2$ for the memory arrays M-ARY$_1$ to M-ARY$_4$. In contact with one-side terminals of the memory arrays M-ARY$_1$ to M-ARY$_4$, there are arranged column switches C-SW$_1$, C-SW$_2$, C-SW$_3$ and C-SW$_4$ for those memory arrays M-ARY$_1$ to M-ARY$_4$, respectively. In contact with the column switches C-SW$_1$ to C-SW$_4$, there are arranged column decoders C-DCR$_1$, C-DCR$_2$, C-DCR$_3$ and C-DCR$_4$ for the memory arrays M-ARY$_1$ to M-ARY$_4$, respectively. In contact with those decoders, on the other hand, there are arranged sense amplifiers SA$_1$, SA$_2$, SA$_3$ and SA$_4$ for the memory arrays M-ARY$_1$ to M-ARY$_4$, respectively. Adjacent to the sense amplifiers SA$_1$ to SA$_4$, there are arranged address buffers ADB$_{2-1}$ and ADB$_{2-2}$ for address signals A$_4$ to A$_{10}$. A data output buffer DOB is arranged adjacent to the address buffer ADB$_{2-1}$, and a $\overline{WE}$ signal input buffer $\overline{WE}$-b, a $\overline{CS}$ signal input buffer $\overline{CS}$-B and a data input buffer DIB are arranged adjacent to the address buffer ADB$_{2-2}$. Along one terminal periphery of the IC chip, there are arranged address signal impression pads P-A$_5$ and P-A$_6$, a data signal take-out pad P-D$_{out}$, a $\overline{WE}$ signal impression pad, P-$\overline{WE}$, an earth potential connection pad P-GND, a $\overline{CS}$ signal impression pad P-$\overline{CS}$, a data signal input pad P-D$_{in}$, and address signal impression pads P-A$_7$, P-A$_8$ and P-A$_9$. In contact with the other terminal side of the memory arrays M-ARY$_1$ to M-ARY$_4$, on the other hand, there are arranged load circuits DLC$_1$, DLC$_2$, DLC$_3$ and DLC$_4$ for the data lines, respectively. Adjacent to the left and right sides of those MISFETs, there are arranged address buffers $ADB_{3-1}$ and $ADB_{3-2}$ for address signals $A_0$ to $A_3$, $A_{12}$ to $A_{13}$. Adjacent to those address buffers $ADB_3$, moreover, there are arranged along the periphery of the IC chip address signal impression pads $P-A_4$, $P-A_3$, $P-A_2$, $P-A_1$ and $P-A_0$, a $V_{CC}$ voltage supply pad $P-V_{CC}$, and address signal impression pads $P-A_{13}$, $P-A_{12}$, $P-A_{11}$ and $P-A_{10}$.

Figure 2:
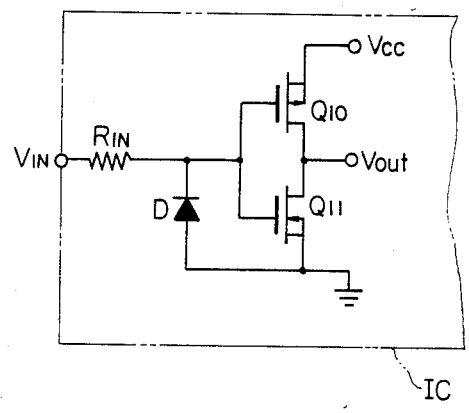
FIG. 2 is an equivalent circuit diagram showing the peripheral circuit unit of the static RAMIC shown in FIG. 1.
Figure 4:
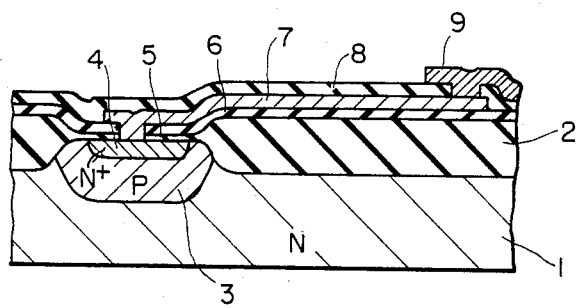
FIG. 4 is a section taken along line X—X of FIG. 3.
Figure 3:
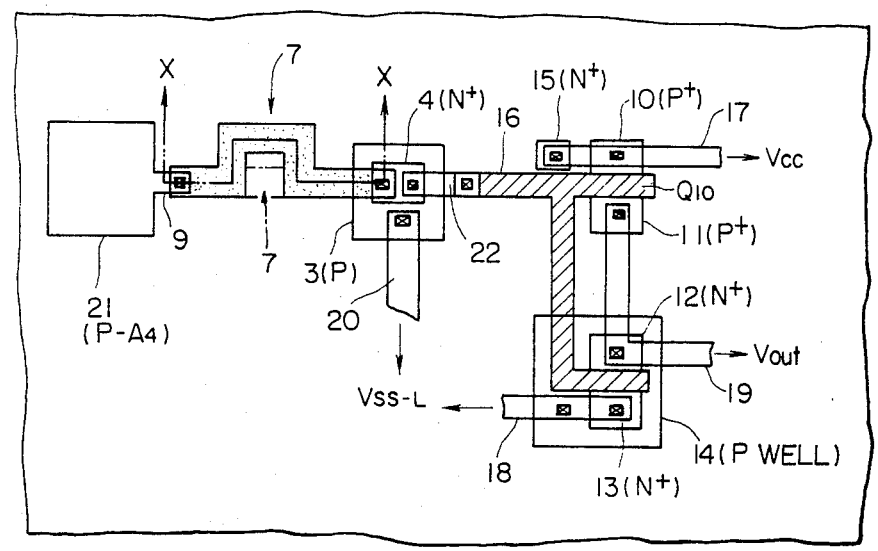
FIG. 3 is an enlarged top plan view showing an essential portion of the peripheral circuit shown in FIG. 2.

In the RAMIC thus constructed, the input protection circuit and the peripheral circuit are so constructed as are shown in FIGS. 2 to 4.

In FIG. 2, an external input terminal $V_{IN}$ to be fed with a signal from the outside of the RAMIC corresponds to one of the address signal impression pads $P-A_0$ to $P-A_{13}$ and the other input signal impression pads $P-\overline{WE}$, $P-\overline{CS}$ and $P-D_{in}$ and is indicated at $P-A_4$, for example. That input terminal $V_{IN}$ is connected with each gate of the C-MOS inverter of the peripheral circuit through a polycrystalline silicon input protection resistor $R_{IN}$ which has the same resistivity as that of a later-described second (or overlying) poly-Si film. That C-MOS inverter is composed of a P-channel MISFET $Q_{10}$ and an N-channel MISFET $Q_{11}$ and forms a part of the address buffer ADB, for example, of FIG. 1. An output $V_{out}$ is commonly taken out of the drains of those two MISFETs and is fed to the subsequent inverter or the like. The MISFET $Q_{10}$ has its source fed with a power source voltage $V_{CC}$ from a power source, which is connected with the voltage supply pad $P-V_{CC}$ of FIG. 1, whereas the other MISFET $Q_{11}$ has its source fixed at the earth potential or a reference potential ($V_{SS}$). Reference letter D indicates an input protection diode for clamping an abnormally excess voltage, which is provided to prevent the gate oxide films of the MISFETs $Q_{10}$ and $Q_{11}$ from being broken by the excess voltage. Letters $R_{IN}$ indicate the input protection resistor which constructs a time constant circuit together with the wiring capacity and which is provided to delay the rising characteristics of an abnormally excess voltage, which has a smaller rising equivalent time constant than the equivalent time constant of the diode D and which is to be impressed upon the protection diode, when that excess voltage is impressed. In other words, the input protection resistor $R_{IN}$ is provided to make gentler the rising waveform of the abnormally excess voltage which is impressed upon the input terminal $V_{IN}$.

The circuit thus constructed at the input side is formed to have such a layout as is schematically shown in FIG. 3, and especially the input protection circuit is shown in section in FIG. 4. Over an N-type silicon substrate 1, there is formed a thick field oxide film 2 for element separation, which is used as a mask to form a P-type semiconductor region 3 by the diffusion technique. Moreover, that region 3 is formed therein with an N-type semiconductor region 4 by the diffusion technique using a thin oxide film 5 as a mask. Those two regions 3 and 4 construct together the protection diode D shown in FIG. 2. Incidentally, numeral 6 indicates a $SiO_2$ film which is prepared by chemical vapor deposition (i.e., CVD), and a poly-Si film 7 serving as the aforementioned input protection resistor $R_{IN}$ is formed over the $SiO_2$ region 6, to extend from the N+-type region 4 through the contact holes which are formed in the $SiO_2$ films 5 and 6. The poly-Si film 7 is made to grow at the same step as that of the later-described second (i.e., overlying) poly-Si layer and is doped with an impurity to have such a specific resistance, of 150 $\Omega/\square$, as to have a higher resistivity than that of a first poly-Si film 16 which forms the gate electrodes of the MISFETs $Q_{10}$ and $Q_{11}$. Numeral 8 indicates a phosphosilicate glass film, and numeral 9 indicates an aluminum wiring which is connected with the external input terminal $V_{IN}$ of FIG. 2. The P-type region 3 is grounded to the earth through an earth potential connection line 20, whereas the N+-type region 4 is connected with the respective gates of MISFETs $Q_{10}$ and $Q_{11}$, which construct the aforementioned C-MOS inverter, by an aluminum wiring 21 and the later-described C-MOS inverter (which is indicated here at 16). In this C-MOS inverter, numerals 10 and 11 indicate the P+-type source and drain regions of the MISFET $Q_{10}$, respectively, and numerals 12 and 13 indicate the N+-type drain and source regions of the MISFET $Q_{11}$, respectively. Moreover, numeral 14 indicates a P-type well region at the N-channel side; numeral 15 a contact N+-type region for biasing the substrate; numeral 17 a $V_{CC}$ voltage supply line of aluminum; numeral 18 an output line of aluminum; numeral 19 an earth potential connection line of aluminum; and numeral 21 a bonding pad which corresponds to the external input terminal $V_{IN}$ of FIG. 2.

In the input protection circuit and the peripheral circuit thus far described, it is important that especially the input protection resistor $R_{IN}$ (or 7) is made of the second (or overlying) poly-Si film and set at such a desired resistivity (about 2 $K\Omega$, for example) as to effect the aforementioned operations. For that importance, the poly-Si film 7 has phosphorous diffused therein so that it may exhibit such a sheet resistance of 150 $\Omega/\square$ similar to the wiring portion of the second poly-Si film of the later-described memory cell as to have a higher resistivity than that in the memory cell. As a result, the poly-Si film 7 exhibits such a relatively high sheet resistivity as is suitable for attaining the desired resistivity of 2 $K\Omega$ so that its occupied area can be reduced, as shown in FIG. 3. Incidentally, the input protection resistor can be formed into a straight line, as is indicated by a single-dotted line in FIG. 3. From the standpoint of the area reduction, the input protection resistor 7 is required to have a suitably high specific resistance and to exhibit such a low resistivity as is freed from blocking the input signal. For this requirement, it is advantageous that the overall resistivity of the input protection resistor 7 be set at 1 to 2 $K\Omega$ while having its sheet resistance of the aforementioned value of about 150 $\Omega/\square$. In the peripheral C-MOS circuit, on the other hand, the polycrystalline silicon wiring 16 to be used as the gate is required to have such a low resistivity as to shorten the signal transmission time and, accordingly, the access time, for example, a sheet resistance of 30 $\Omega/\square$. Nevertheless, the poly-Si film can be formed simultaneously with the first poly-Si film which serves as the gate electrode of the MISFET of the later-described memory cell.

Figure 5:
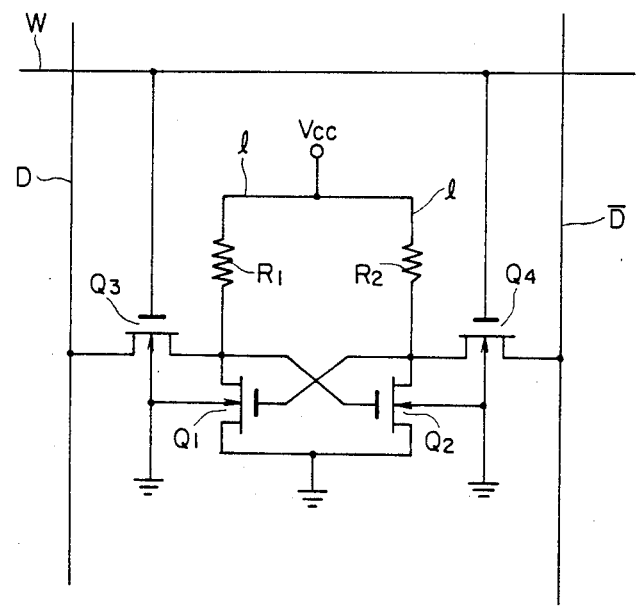
FIG. 5 is an equivalent circuit diagram showing a memory cell of the static RAMIC shown in FIG. 1.

FIG. 5 shows the circuit of the memory cell in one bit of the static RAM shown in FIG. 1.

This memory cell is composed of a flip-flop, which is constructed of the inputs and outputs of a pair of inverter circuits each composed of a load resistor and a driver transistor connected in series; and a pair of transmission gate MISFETs $Q_3$ and $Q_4$. The paired inverter circuits are composed of a first inverter, which has a load resistor $R_1$ and a driver MISFET $Q_1$ connected in series, and a second inverter, which has a load resistor $R_2$ and a driver MISFET $Q_2$ connected in series. The load resistors $R_1$ and $R_2$ have their one-side terminals fed with the voltage $V_{CC}$ through a wiring 1, whereas the driver MISFETs $Q_1$ and $Q_2$ have their source terminals grounded to the earth. Moreover, the output of the first inverter is fed to the gate terminal of the MISFET $Q_2$ of the second inverter, whereas the output of the second inverter is fed to the gate terminal of the MISFET $Q_1$ of the first inverter. The flip-flop having the construction thus far described is used as information memory means. Moreover, the output of the first inverter is connected through the MISFET $Q_3$ with a data line D, whereas the output of the second inverter is connected through the MISFET $Q_4$ with a data line $\overline{D}$. In other words, the transmission gate is used as address means for controlling the information tramsmission between the flip-flop and the complementary data line couple D and $\overline{D}$ and has its operations controlled by the address signal which is to be impressed upon a word line W.

Next, the layout pattern of the memory cell M-CEL of one bit will be described with reference to FIG. 6.

Figure 6:
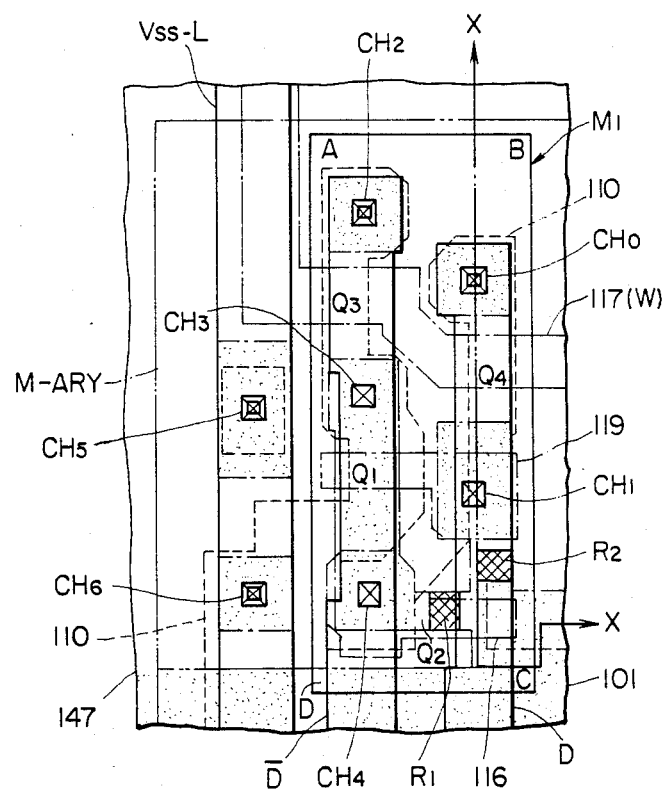
FIG. 6 is an enlarged top plan view showing the memory cell shown in FIG. 5.

In FIG. 6, a section surrounded by a rectangle ABCD is a region which is occupied by the memory cell M-CEL of one bit. On the other hand, broken lines indicate a thick field insulation film 110 made of $SiO_2$ and having a pattern shown in FIG. 9A. Single-dotted lines indicate a polycrystalline silicon layer (i.e., a poly-Si layer). Especially, the regions, which are enclosed by the single-dotted lines but are not studded with points, indicate first poly-Si layers 117, 119 and 116 and have the patterns shown in FIG. 9C. On the contrary, the regions studded with points indicate a second poly-Si layer 147 and a second poly-Si layer over contact holes $CH_0$, $CH_2$, $CH_5$ and $CH_6$ and have the patterns shown in FIG. 9G. Double-dotted lines indicate a memory array M-ARY which is composed of a plurality of memory cells. This memory array M-ARY is a P-type well region which is formed in the N-type semiconductor substrate. Letters D, $\overline{D}$ and $V_{SS}$-L indicate wiring layers made of aluminum. Among these, more specifically, the letters D and $\overline{D}$ indicate the complementary data line couple shown in FIG. 5, and letters $V_{SS}$-L indicate the earth potential supply line. On the other hand, the contact holes $CH_0$, $CH_2$ and $CH_6$ are provided to connect the wiring layers D, $\overline{D}$ and $V_{SS}$-L with the N+-type drain region of the MISFET $Q_4$, the N+-type drain region of the MISFET $Q_3$ and the N+-type source region shared between the MISFETs $Q_1$ and $Q_2$, respectively. The second poly-Si layer is sandwiched between hose aluminum wiring layers and the N+-type semiconductor regions. The contact hole $CH_5$ is provided to connect the P-type well regions of the wiring layer $V_{SS}$-L and the memory array M-ARY while sandwiching the second poly-Si layer inbetween. The contact holes $CH_1$, $CH_3$ and $CH_4$ are provided to connect the second poly-Si layer 147 with the first poly-Si layer 119, the N+-type region which is shared between the drain region of the MISFET $Q_1$ and the source region of the MISFET $Q_3$, and the first poly-Si layer 116, respectively.

Next, the relationships among the aforementioned respective regions will be described with reference to FIG. 5.

Figure 7:
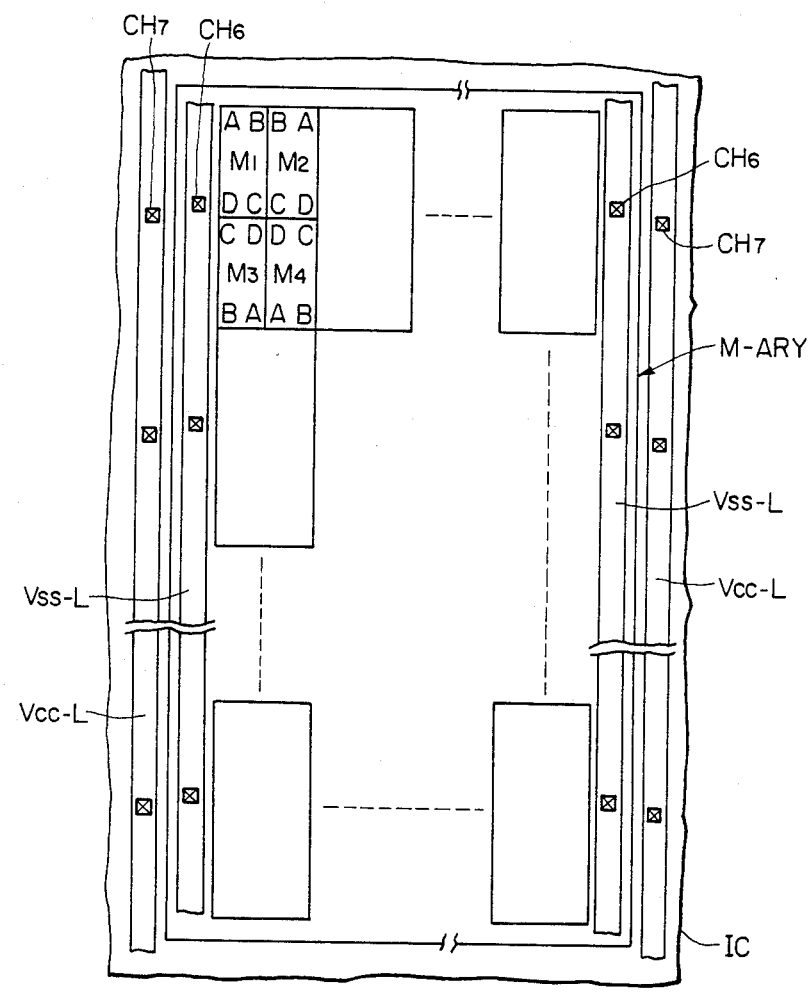
FIG. 7 is a schematic layout showing the overall memory array of the static RAMIC shown in FIG. 1.

First of all, the second poly-Si layer 147 extends at the lower lefthand side of the drawing and is connected with the power source voltage supply line $V_{CC}$-L outside of the memory array M-ARY, as shown in FIG. 7. The power source voltage $V_{CC}$ impressed upon the second poly-Si layer 147 by the aforementioned means is impressed through the higher resistor, which is made of polycrystalline silicon having a higher resistivity, upon the source of the MISFET $Q_4$, the drain of the MISFET $Q_2$ and the gate electrode of the MISFET $Q_1$. In other words, the second poly-Si layer 147 is connected through the contact hole $CH_1$ with the first poly-Si layer 119, which contacts in the so-called "direct" manner with the N+-type semiconductor region shared between the source of the MISFET $Q_4$ and the drain of the MISFET $Q_2$. On the other hand, the aforementioned first poly-Si layer 119 serves as the gate electrode of the MISFET $Q_1$, too, as is apparent from FIG. 5. And, the drain of the MISFET $Q_4$ is connected through the contact hole $CH_0$ with the data line D. Moreover, the aforementioned second poly-Si layer 147 is connected through the other higher resistor $R_1$, which is made of polycrystalline silicon having a higher resistivity, with the drain of the MISFET $Q_1$, the source of the MISFET $Q_3$ and the gate electrode of the MISFET $Q_2$, all of which are shown in FIG. 5. In other words, the second poly-Si layer 147 is connected through the contact hole $CH_4$ with the first poly-Si layer 116 acting as the gate electrode of the MISFET $Q_2$ and further through the contact hole $CH_3$ with the N+-type semiconductor region which is shared between the drain of the MISFET $Q_1$ and the source of the MISFET $Q_3$. Moreover, the drain of the MISFET $Q_3$ is connected through the contact hole $CH_2$ with the data line $\overline{D}$. The gate electrodes of the MISFETs $Q_3$ and $Q_4$ are made of the first poly-Si layer 117, which acts as the word line W shown in FIG. 1, too. This word line W is arranged to intersect the data lines at a right angle. The source regions of the MISFETs $Q_1$ and $Q_2$ merge into each other below the rectangle, which expresses the memory cell of one bit, and shares their N+-type region inbetween. Moreover, this N+-region further extends to the right of and below the outside of the rectangle ABCD, which expresses the memory cell of one bit, and merges into the N+-type region which provides the sources of the MISFETs $Q_1$ and $Q_2$ of the adjoining memory cells. On the other hand, the wiring line $V_{SS}$-L is disposed at the lefthand side of the memory cell, along one side of the memory array M-ARY and in parallel with the data lines. That wiring line $V_{SS}$-L is connected through the contact hole $CH_5$ with the P-type well. As a result, this P-type well is grounded to the earth. The second poly-Si layer exists between the wiring layer $V_{SS}$-L and the P-type well. On the other hand, that wiring layer $V_{SS}$-L is connected through the contact hole $CH_6$ with the aforementioned N+-type regin which extends to the lefthand side of the memory cell. As a result, this N+-region is grounded to the earth. The second poly-Si layer exists between the wiring layer $V_{SS}$-L and the N+-type region. This N+-type region merges into the N+-type region which provides the sources of the MISFETs $Q_1$ and $Q_2$ of the adjoining memory cells, as has been described hereinbefore. As a result, if that N+-type region is connected with the wiring region $V_{SS}$-L in at least one position so that it is grounded to the earth, it becomes necessary to form the wiring layer for supplying the earth potential to those respective memory cells sharing that N+-type region inbetween. In other words, by grounding that N+-type region to the earth, the source regions of the MISFETs $Q_1$ and $Q_2$ of the respective memory cells sharing that N+-type region are grounded to the earth so that the earth potention supply lines for the respective memory cells can be dispensed with.

The overall layout of the memory array will be schematically described in the following with reference to FIG. 7.

Each memory array is arranged with a line (in the direction of the word line) of thirty two sections (i.e., the memory cells of one bit), which are enclosed by the rectangle ABCD shown in FIG. 6, and with a row (in the direction of the data lines) of one hundred and twenty eight sections. First of all, the layout pattern providing a basis for the memory array construction is formed in accordance with the layout pattern of the memory cell of one bit shown in FIG. 6. This basic layout pattern is composed of four memory cells $M_1$ to $M_4$ of one bit, which are so arranged as is shown in FIG. 7. The characters $M_1$ indicate the memory cell having the same layout pattern as that of the memory cell of one bit shown in FIG. 6. The characters $M_1$ indicate the memory cell having such a layout pattern as is axisymmetric to the memory cell $M_1$ with respect to the side BC. The characters $M_3$ indicate the memory cell having such a layout pattern as is centrally symmetric to the memory cell $M_2$ with respect to the point C (or D). The characters $M_4$ indicate the memory cell having such a layout pattern as is axisymmetric to the memory cell $M_3$ with respect to the side DA. The basic layout pattern is so constructed that those memory cells $M_1$ to $M_4$ are arranged continuously without any spacing, as shown in FIG. 7. Moreover, one memory array is constructed by arranging those basic layout patterns continuously without any spacing. More specifically, the memory array is constructed by arranging sixteen basic layout pattern in a line and sixty-four basic layout patterns in a row, as shown in FIG. 7. From the description thus far made, it is understood that the N+-type semiconductor region, which provides the source regions of the MISFETs $Q_1$ and $Q_2$ shown in FIG. 6, and the first poly-Si layer are shared among the four memory cells $M_1$ to $M_4$ and among the sixteen basic layout patterns which are arranged in the line.

Other than the regular layout thus far described, two wiring layers $V_{SS}$-L are arranged at both the sides of the memory array. Below those two wiring layers $V_{SS}$-L, there extend from the adjoining memory cells, as shown in FIG. 6, the N+-type regions which provide the source regions of the MISFETs $Q_1$ and $Q_2$ and which are connected with each other through the contact hole $CH_6$. As a result, those N+-type regions are grounded to the earth. The N+-region thus merging is common among the sixteen basic layout patterns, which are arranged in the common line, as has been described hereinbefore, so that the source regins of the MISFETs $Q_1$ and $Q_2$ of the memory cells of sixty-four bits in the sixteen basic layout patterns are grounded to the earth. As a result, it becomes unnecessary to newly form the wiring layers for supplying the ground potential to the memory cells of sixty-four bits.

Outside of the memory array, two wiring layers $V_{CC}$-L are arranged in parallel with the wiring layers $V_{SS}$-L. Below those two wiring layers $V_{CC}$-L, there extend from the adjoining memory cells, respectively, the second poly-Si layers 147 which merge into each other through the wiring layers $V_{CC}$-L and the contact hole $CH_7$, as shown in FIG. 6. As a result, that second poly-Si layer 147 thus merging is fed with the voltage $V_{cc}$. This second poly-Si layer 147 is shared among the sixteen basic layout patterns, which are arranged in the common line, as has been described hereinbefore, so that the memory cells of sixty-four bits therein are fed with the voltage $V_{CC}$.

As has been described hereinbefore, the static RAMIC according to the present embodiment is characterized in that the input protection resistor $R_{IN}$ (or 7) of the peripheral portion is made of the poly-Si film which has the same resistivity, such as the sheet resistance of 150 $\Omega\square$, as that of the poly-Si wiring 1 (i.e., the second poly-Si layer 147) merging into the load resistors of the memory cell. In other words, we have noticed that the load resistors $R_1$ and $R_2$ of the memory cell have a remarkably high resistivity (e.g., $10^7$ to $10^{10}\Omega$) and have found that there arises no problm in the operations of the memory cell even if the resistivity of the wiring 1 between the load resistors and the power source voltage $V_{CC}$ is enlarged to some level. Therefore, the requirement that the input protection resistor $R_{IN}$ be made to have the desired resistivity can be skillfully met by applying the wiring 1 of the aforementioned load resistors. More specifically, the first poly-Si film of the memory cell has to be doped with an impurity of high concentration, until it has such a low resistivity that it exhibits the sheet resistance of 30 $\Omega/\square$, so that it may be used as the gate and the word line. Therefore, the aforementioned increase in the occupied area cannot be avoided if that poly-Si film is used as the input protection resistor. In the present embodiment, however, the second poly-Si film of the memory cell, which is left undoped with phosphorus, has the sheet resistance of $10^8$ to $10^{11}$ $\Omega/\square$, which is such a sufficient value that the poly-Si film can be used as it is as the load resistor in the memory cell. On the other hand, that wiring 1 (i.e., the second poly-Si film doped with phosphorus) has a relatively low resistance of 150 $\Omega/\square$ but exhibits such a suitable sheet resistivity that it is used as the input protection resistor. As a result, if the second poly-Si film 147 of that wiring portion is used as the input protection resistor $R_{IN}$, a specific resistance is achieved that is about five times as high as that in case the first poly-Si film is used, and the input signal is not blocked. As a result, the area occupied by the input protection resistor can be reduced to about one fifth so that the chip size can be reduced to enhance the high integration.

The input protection resistor according to the present embodiment is prepared at the following step simultaneously with the second poly-Si layer of the memory cell. The fabrication process of the aforementioned static RAM will be described in accordance with FIGS. 8A to 8Q. In these Figures: a region $X_1$ is each of the sectional views at respective steps, which are taken along line X—X of the memory cell M-CEL shown in FIG. 6; a region $X_2$ is each of the sectional views at respective steps, which are taken along line X—X of the input protection resistor shown in FIG. 3; and a region $X_3$ is each of the sectional views at respective steps of the P-channel MISFETs of the peripheral circuit of the memory cell.

Figure 8A:
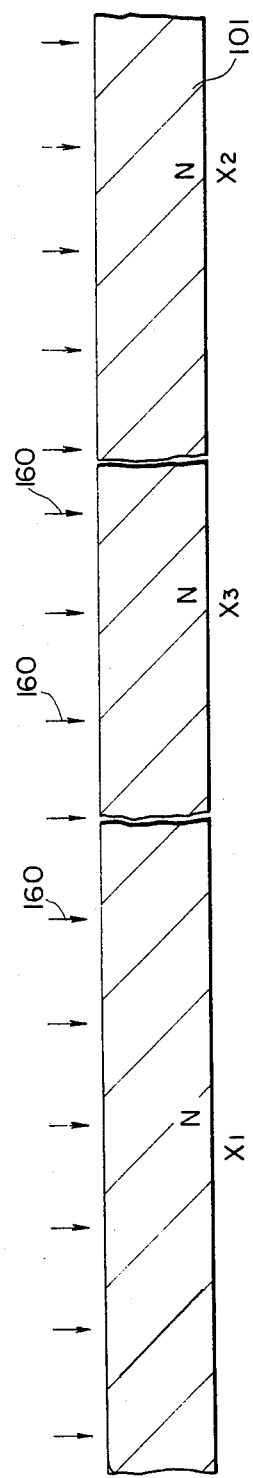
FIGS. 8A to 8Q are sectional views showing sequentially the steps of a fabrication process of fabricating the static RAMIC according to the present invention.

First of all, a semiconductor substrate 101 is prepared, as shown in FIG. 8A. For example, an N-type single crystalline silicon substrate made of a (100) crystal is used as that semiconductor substrate. That substrate has a specific resistance of 8 to 12 $\Omega$cm. An N-type impurity 160 is introduced into all the main face of that silicon substrate by ion implantation, for example. Phosphorus is preferred as that N-type impurity, and the implanting energy and the dose in that case are sufficient at 125 KeV and at $3 \times 10^{12}$ atoms/cm², respectively. The implantation of the phosphorus into all the face is performed by the following reason. That is to say, an N+-type region is formed by implanting the N-type impurity in advance thereby to form a channel stopper for preventing any parasitic MISFET.

Figure 8B:
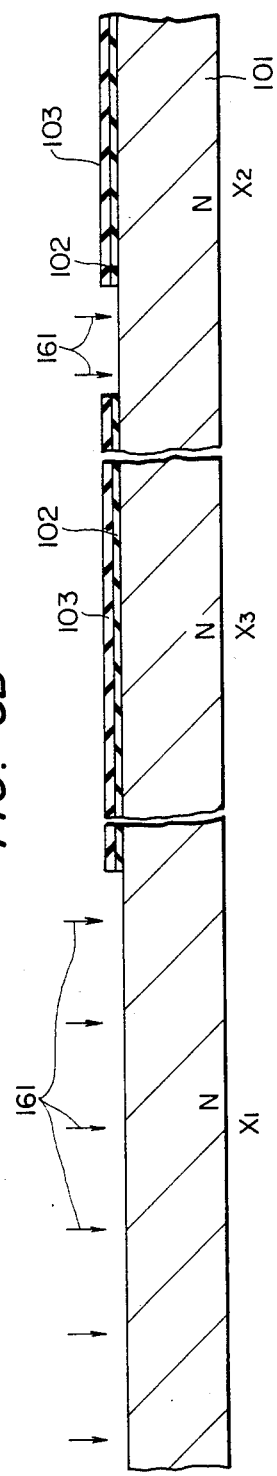

Next, as shown in FIG. 8B, an oxide film (i.e., a SiO$_2$ film) 102 having a thickness of about 500 Å is formed over the face of the silicon substrate 101 by thermal oxidization. Next, in order to remove the SiO$_2$ film 102 existing over the region where a well is to be formed, a photo resist film 103 is selectively formed over the SiO$_2$ film. Moreover, the photo resist film 103 is used as a mask to etch the SiO$_2$ film. Next, under the condition leaving the photo resist film 103, an impurity 161 is introduced to form the well. The impurity used was of P-type. Ion implantation is preferred as the introducing method. For example, boron (B) is preferred as that P-type impurity. In this case, the implantation energy of 75 KeV and the dose of $8 \times 10^{12}$ atoms/cm$^2$ are sufficient. At this time, the boron fails to reach the silicon substrate 101 where the photo resist film 103 is left. On the other hand, the boron introduced into the silicon substrate 101 is sufficient to compensate the concentration of the phosphorus, which has been implanted before into the whole face, thereby to form a P-type well.

Figure 8C:
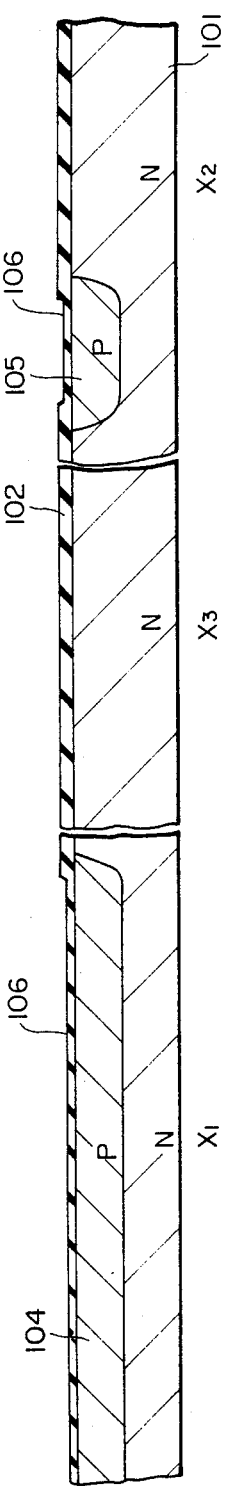

Next, after the photo resist film 103 is removed, as shown in FIG. 8C, the P-type impurity, which has been selectively introduced into the silicon substrate 101, is thermally diffused at a temperature of about 1200° C. to form a well region 104 and a P-type region 105 which is to become the input protection diode shown in FIG. 4. At this time, a thin oxide film 106 is formed over the face of the silicon substrate 101. In the well region 104, there is formed the memory cell which is shown in FIG. 6.

Figure 8D:
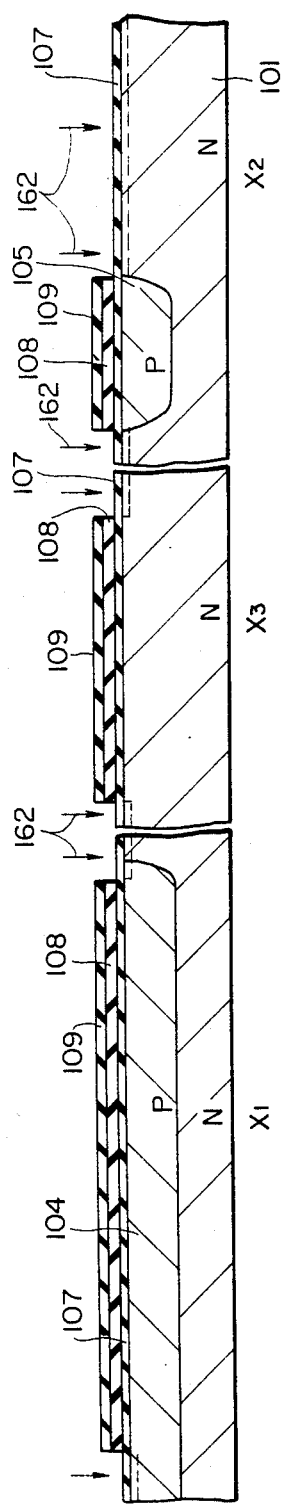

Next, all the oxide film extending over the silicon substrate 101 shown in FIG. 8C is removed to expose the clean face of the silicon substrate 101 to the outside. As shown in FIG. 8D, an oxide film (e.g., a SiO$_2$ film) 107 having a thickness of about 500 Å is formed over the face of the silicon substrate 101. Over this oxide film 107, moreover, an insulation film (i.e., an oxidization resisting film), which is impermeable to oxygen, e.g., a Si$_3$N$_4$ film 108, is formed to have a thickness of about 1400 Å by chemical vapor deposition (i.e., CVD), that Si$_3$N$_4$ film 108 being used as a mask for selectively forming a later-described field insulation film. Incidentally, the aforementioned SiO$_2$ film 107 is formed for the following reason. That is to say, if the Si$_3$N$_4$ film 108 is formed directly over the silicon substrate 101, a crystal defect is established on the face of the silicon substrate 101 due to the thermal strain which is caused as a result of the difference in the coefficient of thermal expansion therebetween. The SiO$_2$ film 107 is formed in order to prevent that crystal defect. Next, in order to complete the mask for forming the later-described field insulation film, a photo resist film 109 is selectively formed over the Si$_3$N$_4$ film. More specifically, the photo resist film 109 is formed in the region other than that where the field insulation film is to be formed. Moreover, that photo resist film 109 is used as a mask to etch the Si$_3$N$_4$ film 108 by the plasma etching process of high precision thereby to form the mask for forming the field insulation film. Under the condition leaving the photo resist film 109, a P-type impurity 162 is introduced into the silicon substrate 101 so as to form a channel stopper. For example, ion implantation is used as the introducing process. In this case, the P-type impurity fails to reach the SiO$_2$ film 107 and the silicon substrate 101 at the region where the photo resist film 109 is left, but goes into the silicon substrate 101 through the SiO$_2$ film 107 at the region where the face is the SiO$_2$ film 107 exposed to the outside. Boron fluoride BF$_2$ is preferred as the aforementioned P-type impurity. The implantation energy of 30 KeV and the dose of $5 \times 10^{13}$ atoms/cm$^2$ are sufficient. The boron ions implanted into the P-type well form a P+-type region to provide the channel stopper. On the contrary, the boron ions implanted into the N-type silicon substrate 101 are compensated by the phosphorus, which has been implanted by the phosphorous implantation shown in FIG. 8A, i.e., by the N-type impurity. As a result, that region is of the N-type thereby to provide the N-type channel stopper.

Figure 8E:
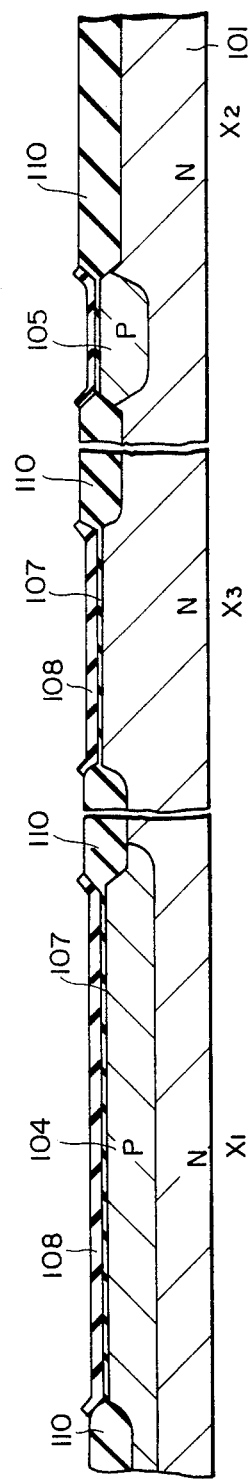

Next, after the photo resist film 109 has been removed, as shown in FIG. 8E, the face of the silicon substrate 101 is selectively thermally oxidized in the oxidizing atmosphere at about 1000° C. to form the field insulation film 110 having a thickness of about 9500 Å. Since, at this time, the Si$_3$N$_4$ film 108 or the oxidization resisting film is impermeable to oxygen, the silicon underlying the Si$_3$N$_4$ film is left unoxidized. During this heat treatment, the aforementioned channel stopper is extended and diffused just below the field insulation film to form the channel stopper having a desired depth (although not shown).

Figure 8F:
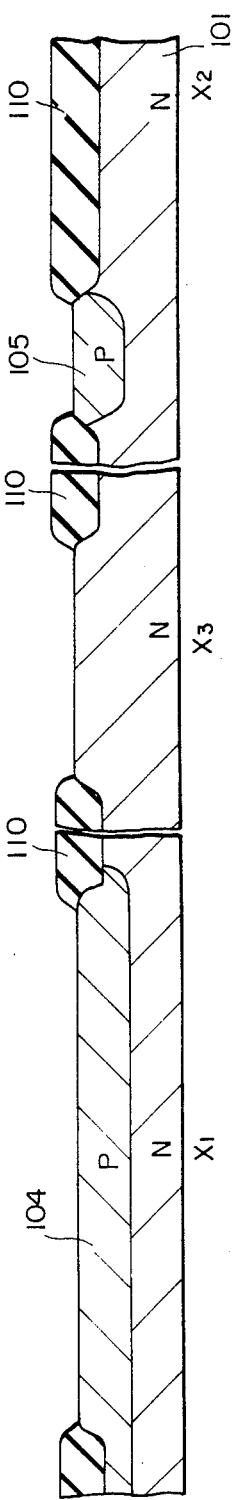
Figure 9A:
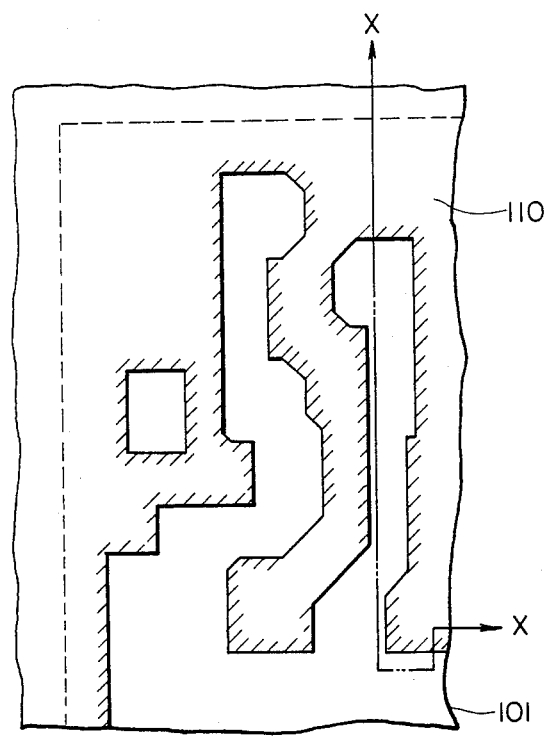
FIGS. 9A to 9H are top plan views showing the memory cell in accordance with the fabrication process shown in FIGS. 8A to 8Q.

Next, after the Si$_3$N$_4$ film 108 has been removed by the use of hot phosphoric acid (H$_3$PO$_4$), for example, the SiO$_2$ film 107 is once removed from the face of the silicon substrate 101, as shown in FIG. 8F, so as to be able to form a clean gate oxide film. For example, the whole face is thinly etched with the use of hydrofluoric acid (HF) to remove the SiO$_2$ film 107 thereby to expose the face of the silicon substrate 101 at a portion, where the field insulation film 110 is not formed, to the outside. The top plan view of the memory cell M-CEL under this condition is shown in FIG. 9A. In other words, the sectional view taken along line X—X of FIG. 9A is shown in the section X$_1$ of FIG. 8F.

Figure 8G:
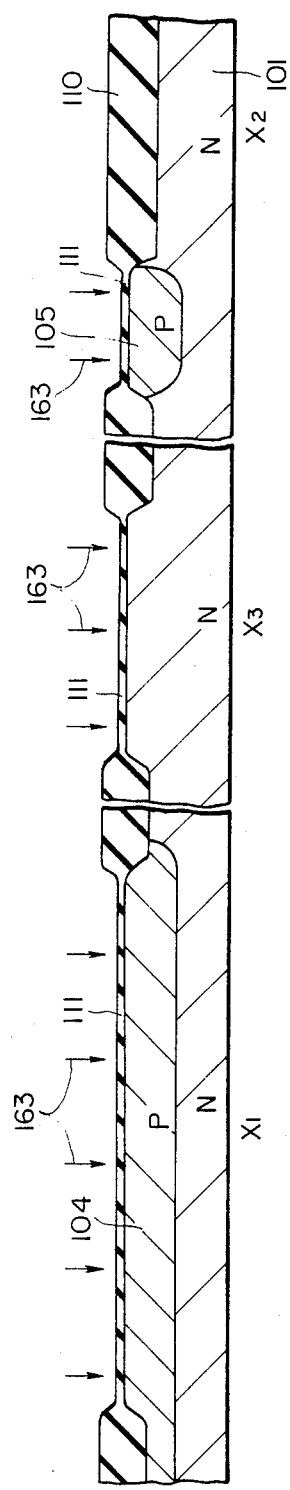

Next, in an oxidizing atmosphere of about 1000° C., the face of the silicon substrate shown in FIG. 8F is formed by the thermal oxidization with a gate insulation film 111 having a thickness of about 400 Å, as shown in FIG. 8G. The gate insulation film 111 thus formed becomes the gate insulation film of all the MISFETs which are formed over the silicon substrate 101. Next, under this condition, ion implantation of a P-type impurity 163 is performed so as to regulate the threshold voltage V$_{th}$ of all the MISFETs. Boron (B) is preferred as the aforementioned P-type impurity. The implantation energy of 30 KeV and the dose of $5.5 \times 10^{11}$ atoms/cm$^2$ are sufficient. This dose is changed with the level of the threshold voltage V$_{th}$. That ion implantation is performed without the use of any mask but all over the face. As a result, all the N-channel MISFETs have an equal threshold voltage V$_{tN}$ whereas all the P-channel MISFETs have an equal threshold voltage V$_{tP}$. On the other hand, the boron ions are implanted into the portion of the region X$_3$, in which the input protection diode is to be formed.

Figure 8H:
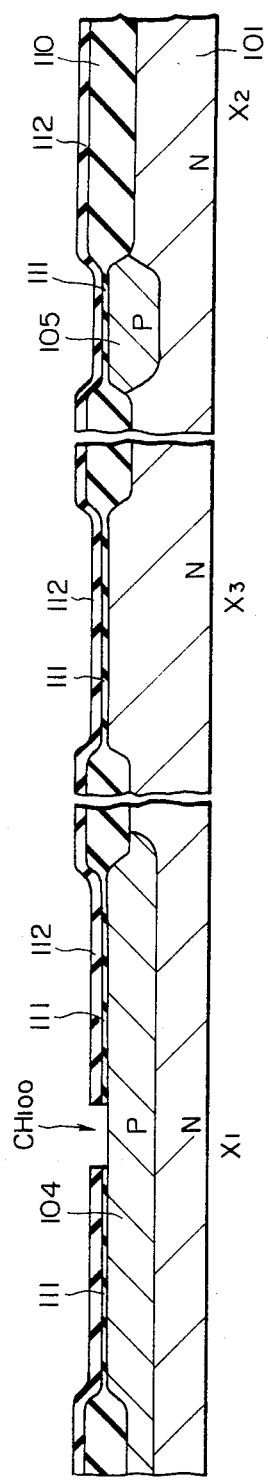
Figure 9B:
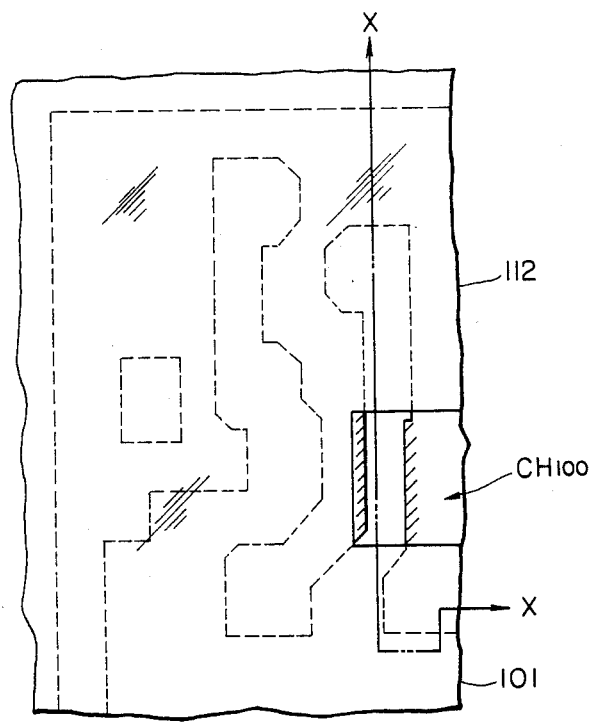

Next, as has been described with reference to FIG. 6, a photo resist film 112 is selectively formed over the SiO$_2$ so as to form the contact holes, which are used to provide direct connection between the later-described first poly-Si layer and the silicon substrate 101, i.e., the so-called "direct contact holes". As shown in FIG. 8H, moreover, the SiO$_2$ film 111 to provide the gate insulation film is etched by using photo resist film 112 as the mask to expose the face of the silicon substrate 101 to the outside thereby to form a direct contact hole $CH_{100}$. This contact hole $CH_{100}$ provides the connections between the MISFETs $Q_1$ and $Q_2$ and the poly-Si resistor $R_2$ having a high resistivity, all of which are shown in FIG. 5. The top plan view of the memory cell M-CEL under this condition is shown in FIG. 9B. In other words, the sectional view taken along line X—X of FIG. 9B is shown in the region $X_1$ of FIG. 8H.

Figure 8I:
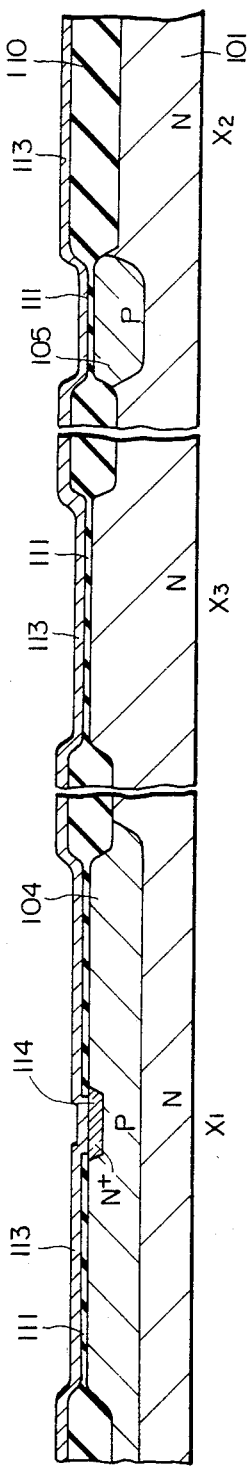

Next, after the photo resist film 112 has been removed, a first conductive layer 113 is formed all over the face, as shown in FIG. 8I. A poly-Si layer doped with an impurity is used as the first conductive layer. First of all, the first poly-Si layer 113 having a thickness of about 3500 Å is formed all over the face by the CVD method. Next, in order to lower the specific resistance of that first poly-Si layer 113, an N-type impurity such as phosphorus is introduced by the diffusion method. As a result, the resistance of the first poly-Si layer 113 is reduced to about 30 $\Psi/\square$. At this time, the phosphorus is diffused from the first poly-Si layer 113 through the direct contact hole $CH_{100}$ into the silicon substrate 101 thereby to form an $N^+$-type region 114. This $N^+$-type region is subjected to a subsequent heat treatment to have a desired depth. The region 114 provides connection between the MISFETs $Q_2$ and $Q_4$ shown in FIG. 5.

Figure 8J:
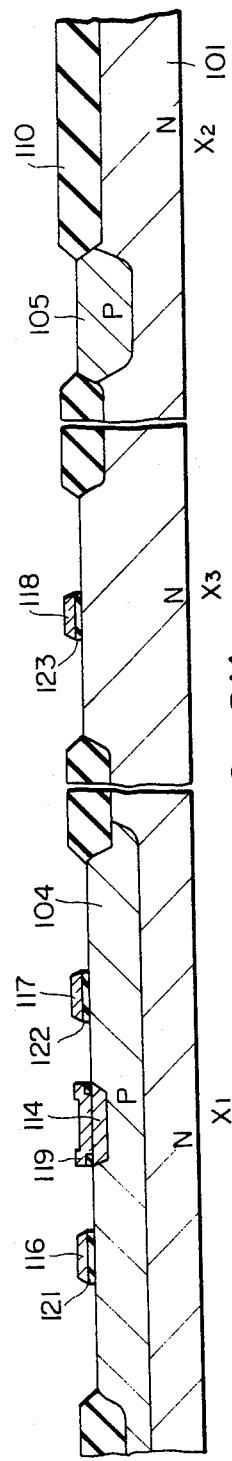
Figure 9C:
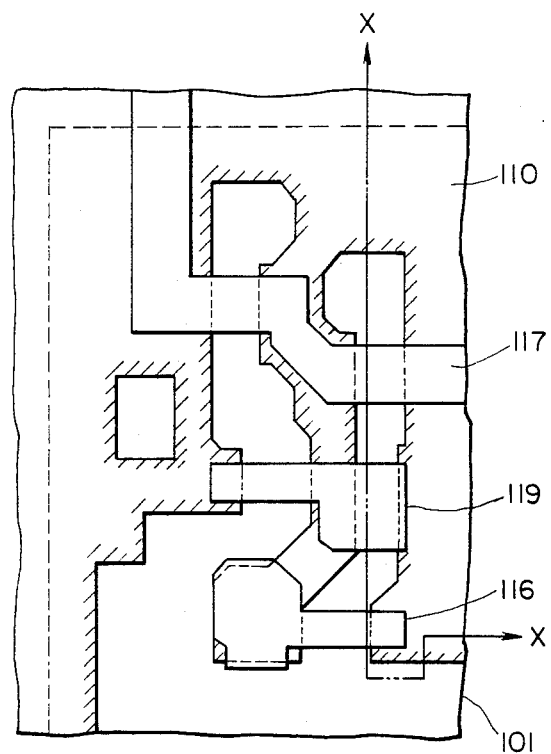

Next, the first poly-Si layer 113, which has been doped with the phosphorous, as has been described hereinbefore, is etched, as shown in FIG. 8J, to have a desired shape by the plasma etching process of high precision thereby to form the gate electrodes 116, 117 and 118 of the MISFETs and the first poly-Si layer 119 which is in the so-called "direct contact" with the silicone substrate 101. Subsequently, the $SiO_2$ film 111 is etched in the same shape to form gate insulation films 121, 122 and 123. At this time, the face of the silicon substrate 101 is selectively exposed to the outside, as shown in FIG. 8J. The top plan view of the memory cell M-CEL under this condition is shown in FIG. 9C. In other words, the sectional view taken along line X—X of FIG. 9C is shown in the region $X_1$ of FIG. 8J.

Figure 8K:
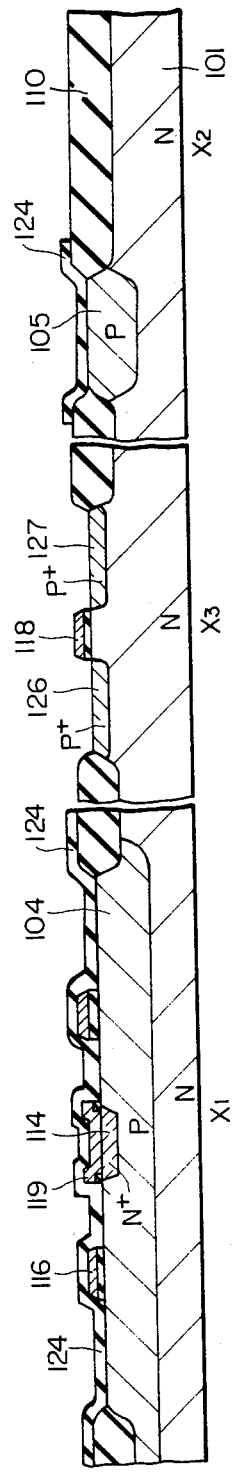
Figure 9D:
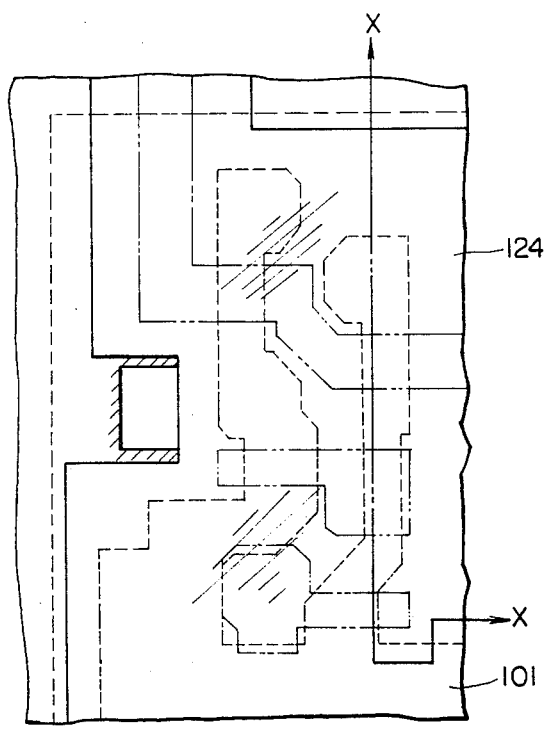

Next, as shown in FIG. 8K, a mask is formed so as to form $P^+$-type source and drain regions. As this mask, for example, there is used a $SiO_2$ film 124 which is selectively formed to have a thickness of about 1500 Å by the CVD method. In other words, the regions, in which the N-channel MISFETs including the memory cell are to be formed, are covered with the $SiO_2$ film 124. Under this condition, moreover, a P-type impurity is introduced by the diffusion method, for example. Boron (B) is preferred as that P-type impurity. As shown in FIG. 8K, the boron is diffused to form the source and drain regions 126 and 127 of all the P-channel MISFETs. Incidentally, a thin oxide film (although not shown) is formed over the face of the silicone substrate 101 in accordance with the heat treatment during that diffusion. The top plan view of the memory cell M-CEL under that condition is shown in FIG. 9D. In other words, the sectional view taken along line X—X of FIG. 9D is shown in the region $X_1$ of FIG. 8K. At this time, a $p^+$-type region for providing connection between the P-type well and the earth potential line $V_{SS}$-L, which are shown in FIG. 6, is formed.

Figure 8L:
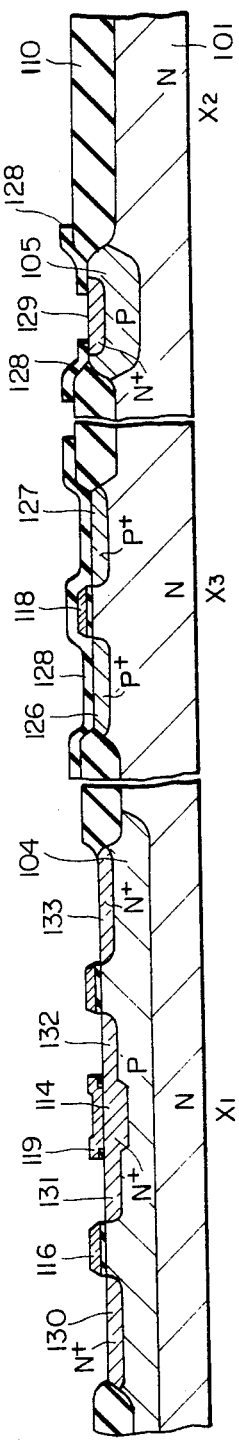
Figure 9E:
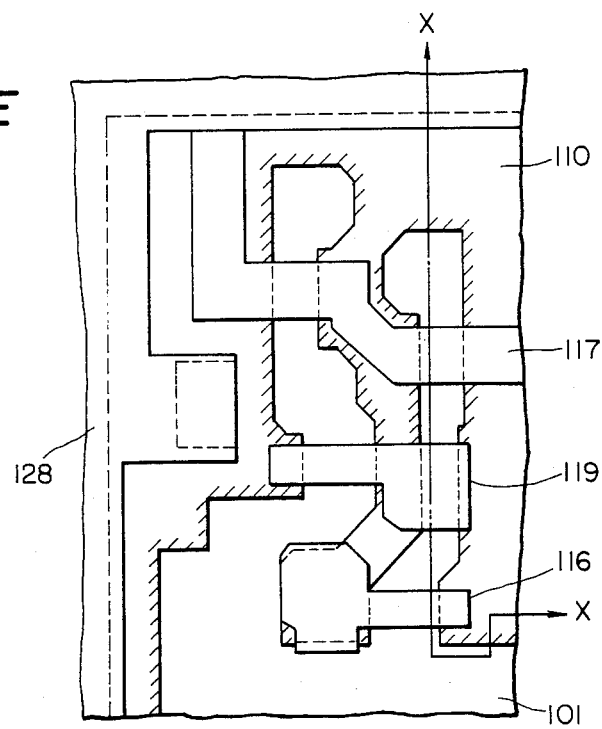

Next, after the aforementioned $SiO_2$ film 124 and the thin oxide film have been removed, a mask 128 is newly formed, as shown in FIG. 8L, so as to form $N^+$-type source and drain regions and emitter regions. The $SiO_2$ film 128, which is selectively formed to have a thickness of about 1500 Å by the CVD method, for example, is used as that mask. In other words, the regions formed with all the P-channel MISFETs are covered with the $SiO_2$ film 128. Moreover, an N-type impurity is introduced under the condition shown in FIG. 8L by the diffusion method, for example. Phosphorus is preferred as that N-type impurity. The phosphorus is diffused into the silicon substrate 101 to form both an $N^+$-type region 129 for forming the input protection diode shown in FIG. 4 and the source and drain regions of all the N-channel MISFETs. Incidentally, a thin oxide film (although not shown) is formed over the face of the silicon substrate 101 in accordance with the heat treatment during that diffusion. The top plan view of the memory cell M-CEL under that condition is shown in FIG. 9E. In other words, the sectional view taken along line X—X of FIG. 9E is shown in the region $X_1$ of FIG. 8L.

Next, after the aformentioned $SiO_2$ film 128 and the thin oxide film have been removed, as shown in FIG. 8M, all the face of the silicon substrate 101, that is exposed to the outside, is thermally oxidized to form an oxide film 134. Since, at this time, the silicon substrate 101 and the poly-Si layers 116 to 119 have different oxidation rates, a $SiO_2$ film having a thickness of about 100 Å is formed over the silicon substrate whereas a $SiO_2$ film having a thickness of about 300 Å is formed over the poly-Si layers 116 to 120. Next, a $SiO_2$ film 135 having a thickness of about 1500 Å is newly formed all over the face by the CVD method. The $SiO_2$ film 135 thus formed is provided to ensure insulation between the silicon substrate and the later-described second conductive layer. Next, over the $SiO_2$ film 135, there is selectively formed a photo resist film (although not shown), which is used as a mask to continuously etch the $SiO_2$ film 135 and the $SiO_2$ film 134 thereby to form contact holes. These contact holes are provided to provide connection between the later-described second conductive layer and the first poly-Si layer 119 or the semiconductor region formed in the silicon substrate 101. Incidentally, the thickness of the $SiO_2$ film 134 is different at positions, i.e., about 300 Å over the poly-Si layers 116 to 119 but about 100 Å over the silicon substrate 101. It is, therefore, necessary to continue the etching operation until the $SiO_2$ film extending over the poly-Si layers 116 to 119 is completely etched. At this time, a mixture solution of $HF+NH_4F$ is preferred as the etching liquid. More specifically, this etching liquid does not act upon silicon so that the silicon substrate 101 is never etched.

Next, as shown in FIG. 8N, a second conductive layer 135 is formed all over the face. A poly-Si layer doped with an impurity is used as the second conductive layer. First of all, the second poly-Si layer 136 is formed all over the face to have a thickness of about 2000 Å by the CVD method. The second poly-Si layer 136 thus formed is used to provide connection between a third conductive layer and the semiconductor region in the silicon substrate 101 or the first poly-Si layer 119, as will be described hereinafter. Moreover, the second poly-Si layer 136 is also used to provide the power source voltage supply wiring and the high resistors $R_1$ and $R_2$, which are shown in FIG. 5.

Figure 9F:
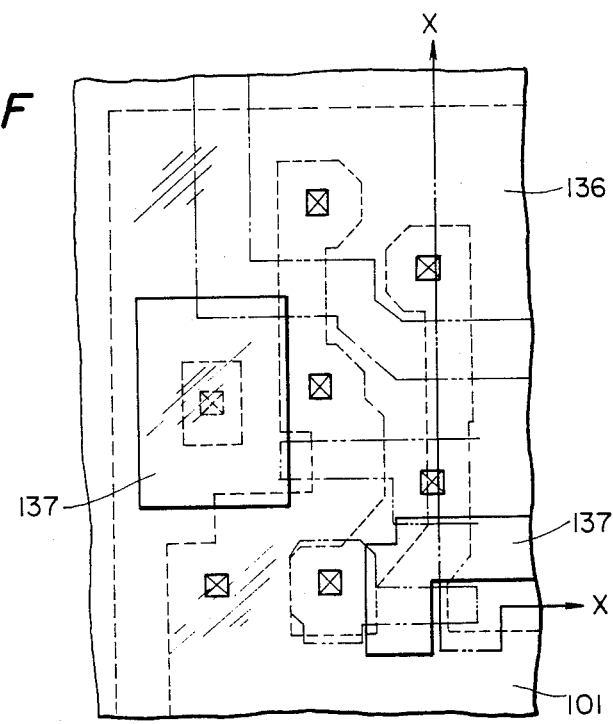

Next, as shown in FIG. 8N, $SiO_2$ films 137, 139 and 140 having a thickness of about 1500 Å are selectively formed by the CVD method to partially cover the second poly-Si layer 136. Under this condition, for example, phosphorous is introduced by the diffusion method so selectively as to reduce the specific resistivity of the second poly-Si layer 136. As a result, the resistance of the second poly-Si layer 136 is reduced to about 150 Ω/□. On the contrary, the phosphorous is not introduced into those portions of the second poly-Si layer, which are covered by the aforementioned SiO$_2$ films 137, 139 and 140. As a result, the polycrystalline silicon having a high specific resistance (e.g., $10^{10}$ to $10^{11}$ Ω/□) is partially left. Incidentally, the phosphorus, which has been diffused into the second poly-Si layer 136, is more or less diffused in the horizontal direction, but the SiO$_2$ films 137, 139 and 140 providing the mask are designed to take that horizontal diffusion into consideration. A second poly-Si layer 141 having a high resistivity, which is covered with the SiO$_2$ film 137, is used as the high resistor R$_2$ shown in FIG. 5. Moreover, second poly-Si layers 143 and 144, which are covered with the SiO$_2$ films 139 and 140, are turned into the P-type poly-Si layers having a low specific resistance as a result that the P-type metal constructing a later-described third conductive layer is diffused when said third conductive layer is to be connected. The top plan view of the memory cell M-CEL under this condition is shown in FIG. 9F. In other words, the sectional view taken along line X—X of FIG. 9F is shown in the region X$_1$ of FIG. 8N.

Figure 9G:
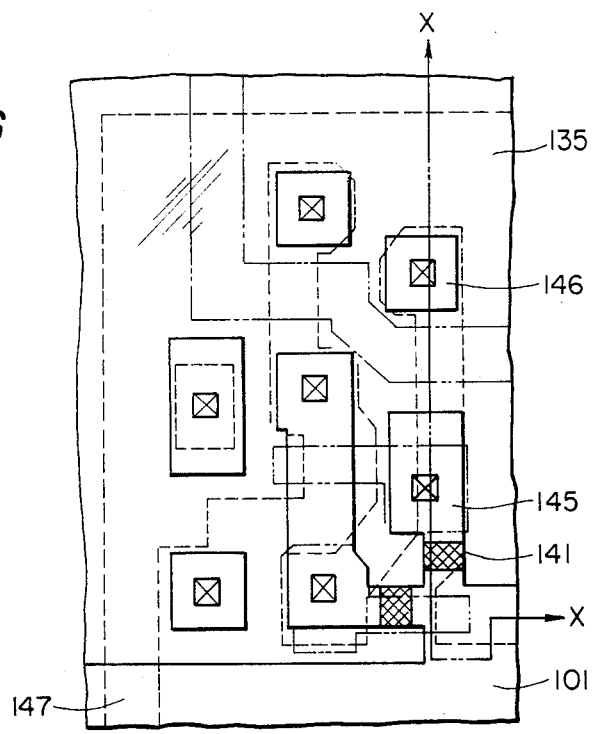

Next, after the SiO$_2$ films 137, 139 and 140 have been removed, the second poly-Si layer 136 is etched to a desired shape to form electrodes 145, 146, 150 and 151 and the wiring layer 147 and an input protection resistor 148, as shown in FIG. 8O. The electrodes 150 and 151 are used for providing connections with the source and drain regions of all the P-channel MISFETs. The input protection resistor 148 is used as the resistor R$_{IN}$ shown in FIG. 2. The electrode 146 is used as the electrode of the MISFET Q$_4$ shown in FIG. 5. The wiring layer 147 is supplied with the power source voltage V$_{CC}$, as shown in FIG. 5, and is connected through the highly resistive poly-Si layer 141 (or R$_2$) with the first poly-Si layer 119 which is in the so-called "direct contact" with the source and drain regions of the MISFETs Q$_1$ and Q$_4$. The top plan view of the memory cell M-CEL under this condition is shown in FIG. 9G. In other words, the sectional view taken along line X—X of FIG. 9G is shown in the region X$_1$ of FIG. 8O.

Figure 8P:
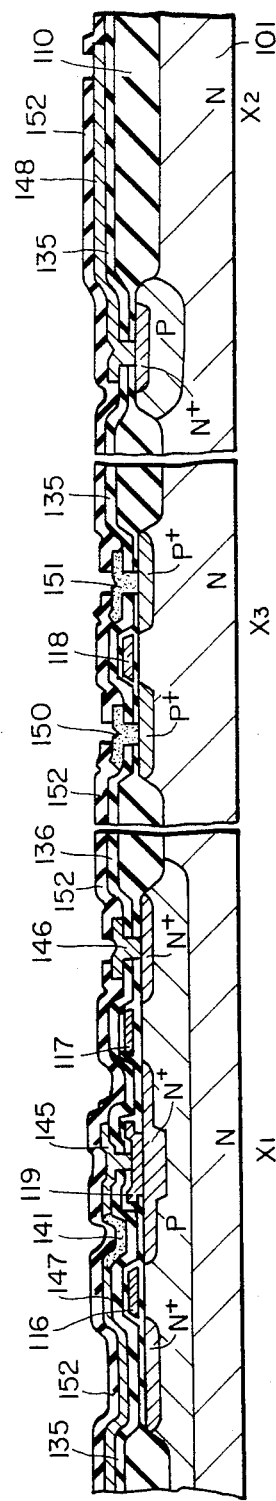

Next, as shown in FIG. 8P, an interlayer insulating film 152 is formed all over the face. A phosphosilicate glass film is preferred as that interlayer insulation film. This glass film 152 is formed to have a thickness of about 6500 Å by the CVD method. The glass film 152 thus formed is required as the interlayer insulation film between the later-described conductive layer and the second poly-Si layer. Next, a photo resist film (although not shown) is selectively formed and is used as a mask to etch the glass film 152 thereby to form contact holes.

Figure 8Q:
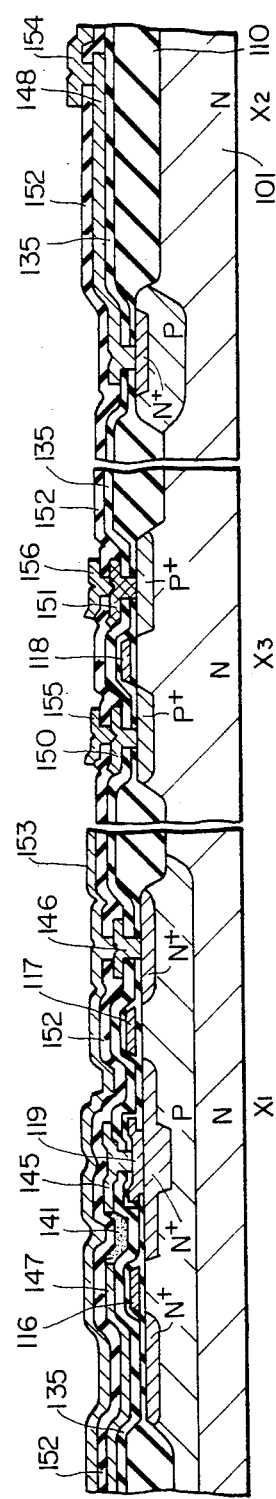
Figure 9H:
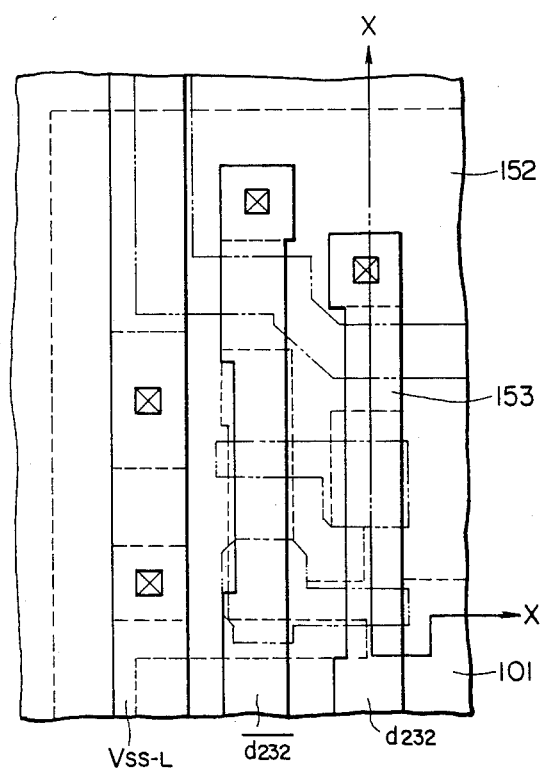

Next, as shown in FIG. 8Q, third conductive layers 153 to 156 are selectively formed. For example, aluminum (Al), which exhibits the P-type to the silicon, is preferred for those third conductive layers. The aluminum layers 153 to 156 are formed to have a thickness of about 8000 Å by vacuum evaporation. At this time, the aluminum is diffused into the electrodes 150 and 151, which are made of the second poly-Si layer having a high resistivity, so that P-type conductive layers having a low specific resistance are formed. The electrode 153 is used as the data line shown in FIG. 5. The top plan view of the memory cell M-CEL under this condition is shown in FIG. 9H. In other words, the sectional view taken along line X—X of FIG. 9H is shown in the region X$_1$ of FIG. 8Q. Incidentally, FIG. 9H is identical to FIG. 6.

As is now apparent from the steps thus far described, according to the present embodiment, the first poly-Si layer is doped with the impurity of high concentration to have a low resistivity thereby to provide the gate electrodes of the MISFETs and the word line, and the second poly-Si layer is made to grow over the memory cell simultaneously into the input protection resistor film and is doped with the impurity to be changed into such a resistive film as is suitable as the wirings or input resistors in the memory cell, whereas the portions undoped with the impurity are left as the load resistors of the memory cell. As a result, the poly-Si films having suitable resistivities as the input resistors can be easily prepared without any change in the existing RAM fabrication process.

According to the present embodiment, moreover, the first and second poly-Si films, and the poly-Si film, which is made to have three kinds of resistivities in accordance with the existence of the doping step of the first and second poly-Si films with the impurity and with the doping extent, can be advantageously used in different modes including the aforementioned one and a variety of suitable ones. Still moreover, since the input protection resistor is formed of the second poly-Si film, another pattern such as the MISFET using the resistor or the first poly-Si film as its gate electrode may be placed to underlie the second poly-Si film.

Although the present invention has been exemplified hereinbefore, the embodiment thus far described may be further modified in accordance with the technical concept of the present invention. For example, the resistivities of the input protection resistor and the wirings of the load resistors of the memory cell can be changed in various manners in accordance with the doping extent and kind of the impurity, and the pattern itself may also be changed in various manners. On the other hand, the gates and word lines of the MISFET unit need not be made of the aforementioned first poly-Si film but may be made instead of metal having a high melting point such as Mo, W or Ta, or its silicide. Moreover, the conduction types of the aforementioned respective semiconductor regions and the materials of the respective layers used may be changed.

As has been described hereinbefore, according to the present invention, since the protection resistor of the peripheral circuit unit is made of the poly-Si film which has substantially the same resistivity as that of the overlying poly-Si film merging into the load resistor of the memory cell unit, it can have such a relatively high resistivity as does not block the input signal so that it can have a sufficient resistivity even if it has its occupied area reduced, whereby the chip size can be accordingly remarkably reduced. Moreover, since that protection resistor is formed at the same step as that of the overlying poly-Si film, it can be fabricated easily with a high yield without any change in the existing steps.

What is claimed is:

1. A process for fabricating a semiconductor memory device having MIS transistors composing memory cells, the memory cells having load resistors, the load resistors being connected to a power supply line, and peripheral circuits having MIS transistors, with the gate of at least one of the MIS transistors of the peripheral circuit being connected with a protection resistor, comprising the steps of:

forming a first film of an electrically conductive material, which serves as the gate of the MIS transistors composing memory cells of the semiconductor memory device, over a semiconductor substrate, said first film having a first resistivity;

forming an insulation film to cover the semiconductor substrate which is formed with each of the MIS transistors composing said memory cells; and forming second films, which second films include a layer of polycrystalline silicon, which second films respectively serve as each load resistor of each of said memory cells, as a wiring for connecting the load resistors with a power supply line and as the protection resistor connected with the gate of at least one of the MIS transistors composing peripheral circuits, over said insulation film covering said semiconductor substrate, the resistivity of the second films serving as said protection resistor and as said wiring being lower than that of the second film serving as said load resistor and higher than that of said first film.

2. A process for fabricating a semiconductor memory device according to claim 1, wherein said first film is formed by depositing polycrystalline silicon and doping the polycrystalline silicon with impurtity ions to lower the resistivity thereof to said first resistivity.

3. A process for fabricating a semiconductor memory device according to claim 1, wherein said first film is formed by depositing a metal having a high melting point, or a silicide thereof.

4. A process for fabricating a semiconductor memory device according to claim 1, wherein the forming the second films includes depositing polycrystalline silicon at the locations of each load resistor of the memory cells, at the location of the wiring for connecting the load resistors with a power supply line, and at the location of the protection resistor; masking the polycrystalline silicon at the location of each load resistor; and introducing impurtity ions into the polycrystalline silicon at the location of the wiring and protection resistor to lower the resistivity thereof, said impurity ions being introduced into the polycrystalline silicon in an amount such that the resistivity thereof is lower than that of the polycrystalline silicon serving as the load resistor but higher than that of the first film.

5. A process for fabricating a semiconductor memory device according to claim 1, wherein said protection resistor is in electrical contact with a protection diode formed in the semiconductor substrate, and wherein said process comprises the additional steps of:

introducing impurity ions of a first conductivity type, opposite to that of the substrate, into the semiconductor substrate at the location at which the protection resistor is formed to contact the substrate, to form a first semiconductor region of conductivity type opposite to that of the semiconductor substrate, in the semiconductor substrate at the location at which the protection resistor is formed to contact the substrate; and introducing impurity ions of conductivity type opposite to said first conductivity type into said first semiconductor region, to form a second semiconductor region in the first semiconductor region, of conductivity type opposite to the conductivity type of the first semiconductor region; and wherein the protection resistor means is formed in contact with the second semiconductor region, the first and second semiconductor regions forming said protection diode.

6. A process for fabricating a semiconductor memory device according to claim 1, wherein all of said second films are formed simultaneously.

7. A process for fabricating a semiconductor memory device according to claim 1, wherein said forming said second films includes selectively forming a layer of polycrystalline silicon at the location for each load resistor, at the location for said wiring, and at the location for said protection resistor.

8. A process for fabricating a semiconductor memory device according to claim 2, wherein said impurity ions are phosphorus ions.

9. A process for fabricating a semiconductor memory device according to claim 7, wherein said selectively forming a layer of polycrystalline silicon includes forming a continuous layer of polycrystalline silicon over the surface of the semiconductor substrate and selectively removing portions of said continuous layer.

10. A process for fabricating a static random access memory device having MIS transistors composing memory cells, the memory cells having load resistors, and peripheral circuits having MIS transistors, with the gate of at least one of the MIS transistors of the peripheral circuits being connected with a protection resistor means, comprising the steps of:

forming a first level conductive film over a semiconductor substrate, said first level conductive film forming the gate electrodes of the MIS transistors of the memory cells;

forming an insulator film over said semiconductor substrate; and forming second level conductive films over said semiconductor substrate, said second level conductive films including a polycrystalline silicon layer, said second level conductive films being formed simultaneously at the location of said load resistors and at the location of said protection resistor means, whereby said second level conductive films to form said load resistor and at least a part of said protection resistor means are simultaneously provided.

11. A process for fabricating a static random access memory device according to claim 10, wherein said first level conductive film is formed to have a first resistivity and said second level conductive films are formed to have a second resistivity, and wherein said process includes the further step of doping impurity ions into the polycrystalline silicon layer of said second level conductive films at the location of said protection resistor means to lower the resistivity thereof, to thereby form protection resistor means having a resistivity greater than said first resistivity but less than said second resistivity.

12. A process for fabricating a static random access memory device according to claim 10, wherein said second level conductive films consist of said polycrystalline silicon layer.

13. A process for fabricating a static random access memory device according to claim 10, wherein said forming said first level conductive film includes forming the first level film at the location of wiring for said peripheral circuits.

14. A process for fabricating a static random access memory device according to claim 10, wherein said first film is formed by depositing polycrystalline silicon and doping the polycrystalline silicon with impurity ions to lower the resistivity thereof to said first resistivity.

15. A process for fabricating a static random access memory device according to claim 10, wherein said first film is formed by depositing a metal having a high melting point, or a silicide thereof.

16. A process for fabricating a static random access memory device according to claim 10, wherein said protection resistor means is in electrical contact with a protection diode fomed in the semiconductor substrate, and wherein said process comprises the additional steps of:
   introducing impurity ions of a first conductivity type, opposite to that of the substrate, into the semiconductor substrate at the location at which the protection resistor means is formed to contact the substrate, to form a first semiconductor region, of conductivity type opposite to that of the semiconductor substrate, in the semiconductor substrate at the location at which the protection resistor means is formed to contact the substrate; and
   introducing impurity ions of conductivity type opposite to said first conductivity type into said first semiconductor region, to form a second semiconductor region, in the first semiconductor region, of conductivity type opposite to the conductivity type of the first semiconductor region; and
   wherein the protection resistor means is formed in contact with the second semiconductor region, the first and second semiconductor region forming said protection diode.

17. A process for fabricating a static random access memory device according to claim 10, wherein said forming second level conductive films includes the steps of forming a continuous film of polycrystalline silicon over said semiconductor substrate and selectively removing said continuous film to leave said second level conductive films.

18. A process for fabricating a static random access memory device according to claim 11, wherein said step of doping impurity ions includes the sub-step of forming a mask on the polycrystalline silicon layer at the location of at least said load resistors, and introducing said impurity ions selectively into the polycrystalline silicon using said mask.

19. A process for fabricating a static random access memory device according to claim 13, wherein said forming said first level conductive film includes forming the first level film at the location of the gate electrodes for the MIS transistors of the peripheral circuits.

20. A process for fabricating a static random access memory device according to claim 14, wherein said impurity ions are phosphorus ions.

21. A process for fabricating a static random access memory device according to claim 16, wherein the introducing impurity ions to form the second semiconductor region is performed after forming the first level conductive film but prior to forming the second level conductive films.

22. A process for fabricating a static random access memory device according to claim 16, wherein the step of introducing impurity ions for forming the second semiconductor region includes introducing the impurity ions into the semiconductor substrate at each side of the gate electrodes of the MIS transistors of the memory cell to form the source and drain regions for the MIS transistors of the memory cell, whereby the source and drain regions for the MIS transistors of the memory cell are formed simultaneously with said second semiconductor region.

23. A process for fabricating a static random access memory device according to claim 22, wherein the MIS transistors of the memory cell are formed in a well region of conductivity type opposite to that of the substrate, and wherein the step of introducing impurity ions for forming the first semiconductor region includes introducing impurity ions into the semiconductor substrate at a location spaced from the first semiconductor region to form said well region, whereby the well region is formed simultaneously with the first semiconductor region.

* * * * *